(12) United States Patent
Chan

(10) Patent No.: US 6,338,313 B1
(45) Date of Patent: *Jan. 15, 2002

(54) SYSTEM FOR THE PLASMA TREATMENT OF LARGE AREA SUBSTRATES

(75) Inventor: Chung Chan, Newton, MA (US)

(73) Assignee: Silison Genesis Corporation, Campbell, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/065,953

(22) Filed: Apr. 24, 1998

Related U.S. Application Data

(63) Continuation of application No. 08/878,005, filed on Jun. 18, 1997, which is a continuation-in-part of application No. 08/503,973, filed on Jul. 19, 1995, now Pat. No. 5,653,811.

(51) Int. Cl.[7] ............................................. C23C 16/00
(52) U.S. Cl. ........................... 118/723 I; 118/723 MP; 118/718; 118/719; 315/111.81
(58) Field of Search ................................. 118/718, 719, 118/729, 723 I, 723 MP; 204/298.24, 298.25; 156/345; 315/111.81

(56) References Cited

U.S. PATENT DOCUMENTS

| 3,855,110 A | * | 12/1974 | Quinn et al. ................. 204/298 |
| 3,926,147 A | | 12/1975 | Steube ........................ 118/49.1 |
| 4,006,340 A | | 2/1977 | Gorinas .................... 219/121 P |
| 4,042,128 A | * | 8/1977 | Shrader ..................... 214/17 B |
| 4,304,983 A | | 12/1981 | Pierfederici ........... 219/121 PG |

(List continued on next page.)

FOREIGN PATENT DOCUMENTS

| DE | 44 03 125 A1 | 2/1994 | |
| EP | 379 828 | 12/1989 | |
| EP | 459 177 | 5/1991 | |
| EP | 0 517 042 B1 | 10/1995 | ........... C23C/16/48 |
| EP | 860 854 | 8/1998 | |
| GB | 2 231 197 | 7/1990 | |
| JP | 0193904 | 11/1984 | ............ 118/723 IR |
| JP | 59-193904 | 11/1984 | |
| WO | WO 93/18201 | 9/1993 | |

OTHER PUBLICATIONS

Pieter Burggraaf, Sr. Ed., "Advanced Plasma Sources: What's Working?," *Semiconductor International*, pp. 56–58, 60, May 1994.

(List continued on next page.)

*Primary Examiner*—Jeffrie R. Lund
(74) *Attorney, Agent, or Firm*—Townsend and Townsend and Crew LLP

(57) ABSTRACT

A cluster tool for providing plasma treatment to a substrate includes a plurality of chambers to provide plasma treatment to the substrate. At least one of the chambers performs ion implantation to the substrate. A dielectric window is provided on a surface of the chamber which performs ion implantation to the substrate. A plasma source is provided external to the chamber which performs ion implantation to the substrate. The plasma source is at a distance proximate enough to provide a plasma within the chamber.

21 Claims, 11 Drawing Sheets

U.S. PATENT DOCUMENTS

| | | | |
|---|---|---|---|
| 4,371,412 A | | 2/1983 | Nishizawa .................. 156/345 |
| 4,461,783 A | * | 7/1984 | Yamazaki .................... 427/39 |
| 4,500,563 A | | 2/1985 | Ellenberger et al. .......... 427/38 |
| 4,566,403 A | | 1/1986 | Fournier ..................... 118/718 |
| 4,615,298 A | * | 10/1986 | Yamazaki ................... 118/723 |
| 4,764,394 A | | 8/1988 | Conrad ........................ 427/38 |
| 4,803,332 A | | 2/1989 | Koyama et al. ....... 219/121.52 |
| 4,811,684 A | * | 3/1989 | Tashiro et al. ............. 118/50.1 |
| 4,846,928 A | | 7/1989 | Dolins et al. ............... 156/626 |
| 4,847,792 A | | 7/1989 | Barna et al. ................ 364/552 |
| 4,853,250 A | | 8/1989 | Boulos et al. ................ 427/34 |
| 4,887,005 A | | 12/1989 | Rough et al. ........... 315/111.21 |
| 4,948,458 A | * | 8/1990 | Ogle .......................... 156/643 |
| 4,950,956 A | | 8/1990 | Asamaki et al. ........ 315/111.21 |
| 4,951,601 A | * | 8/1990 | Maydan et al. ............. 118/719 |
| 4,952,273 A | | 8/1990 | Popov ........................ 156/643 |
| 4,960,073 A | | 10/1990 | Suzuki et al. ............... 118/723 |
| 4,996,077 A | | 2/1991 | Moslehi et al. ............... 427/38 |
| 5,015,353 A | | 5/1991 | Hubler et al. .......... 204/192.31 |
| 5,133,826 A | | 7/1992 | Dandl ......................... 156/345 |
| 5,183,775 A | | 2/1993 | Levy ............................ 437/60 |
| 5,202,095 A | | 4/1993 | Houchin et al. ............ 422/186 |
| 5,203,960 A | | 4/1993 | Dandl ......................... 156/643 |
| 5,234,529 A | | 8/1993 | Johnson ..................... 156/345 |
| 5,250,328 A | | 10/1993 | Otto ........................... 427/535 |
| 5,252,178 A | | 10/1993 | Moslehi ...................... 156/643 |
| 5,273,610 A | | 12/1993 | Thomas, III et al. ....... 156/345 |
| 5,277,751 A | | 1/1994 | Ogle .......................... 156/643 |
| 5,280,154 A | | 1/1994 | Cuomo et al. ......... 219/121.52 |
| 5,286,296 A | * | 2/1994 | Sato et al. .................. 118/719 |
| 5,289,010 A | | 2/1994 | Shohet .................. 250/492.21 |
| 5,296,272 A | | 3/1994 | Matossian et al. .......... 427/523 |
| 5,342,472 A | | 8/1994 | Imahashi et al. ........... 156/345 |
| 5,346,578 A | * | 9/1994 | Benzing et al. ............. 156/345 |
| 5,354,381 A | | 10/1994 | Sheng .................... 118/723 E |
| 5,362,353 A | | 11/1994 | Mallon ....................... 156/345 |
| 5,368,710 A | | 11/1994 | Chen et al. ............ 204/192.32 |
| 5,370,765 A | | 12/1994 | Dandl ......................... 156/643 |
| 5,374,456 A | | 12/1994 | Matossian et al. .......... 427/570 |
| 5,401,350 A | * | 3/1995 | Patrick et al. ............... 156/345 |
| 5,404,079 A | | 4/1995 | Ohkuni et al. .......... 315/111.81 |
| 5,405,480 A | | 4/1995 | Benzing et al. ............. 156/345 |
| 5,411,591 A | | 5/1995 | Izu et al. .................... 118/718 |
| 5,411,592 A | | 5/1995 | Ovshinsky et al. ......... 118/718 |
| 5,413,955 A | | 5/1995 | Lee et al. ..................... 437/86 |
| 5,435,880 A | | 7/1995 | Minato et al. .............. 156/345 |
| 5,436,175 A | | 7/1995 | Nakato et al. ................. 437/24 |
| 5,464,476 A | * | 11/1995 | Gibb et al. ........... 118/723 MP |
| 5,487,785 A | | 1/1996 | Horiike et al. ........... 118/723 E |
| 5,490,910 A | * | 2/1996 | Nelson et al. .......... 204/192.15 |
| 5,498,290 A | | 3/1996 | Matossian et al. ....... 118/723 E |
| 5,504,328 A | | 4/1996 | Bonser ....................... 250/288 |
| 5,531,834 A | | 7/1996 | Ishizuka et al. .......... 118/723 I |
| 5,554,223 A | * | 9/1996 | Imahashi ................. 118/723 I |
| 5,571,366 A | * | 11/1996 | Ishii et al. ................... 156/345 |
| 5,614,055 A | * | 3/1997 | Fairbairn et al. ........... 156/345 |
| 5,648,701 A | | 7/1997 | Hooke et al. ........... 315/111.21 |
| 5,651,868 A | * | 7/1997 | Canady et al. ......... 204/298.25 |
| 5,653,811 A | * | 8/1997 | Chan ....................... 118/723 I |
| 5,654,043 A | | 8/1997 | Shao et al. .................. 427/527 |
| 5,661,043 A | | 8/1997 | Rissman et al. ............ 438/162 |
| 5,683,548 A | * | 11/1997 | Hartig et al. ............. 156/643.1 |
| 5,707,486 A | * | 1/1998 | Collins .................... 156/643.1 |
| 5,710,057 A | | 1/1998 | Kenney ........................ 437/62 |
| 5,711,812 A | | 1/1998 | Chapek et al. ........... 118/723 E |
| 5,726,413 A | * | 3/1998 | Baenzinger et al. ... 219/121.43 |
| 5,772,832 A | * | 6/1998 | Collins et al. .............. 156/345 |
| 5,976,259 A | * | 11/1999 | Yamazaki ................... 118/719 |
| 6,051,073 A | | 4/2000 | Chu et al. ................... 118/723 |
| 6,068,784 A | * | 5/2000 | Collins et al. ................ 216/68 |
| 6,136,140 A | * | 10/2000 | Ishii et al. ................... 156/345 |
| 6,204,607 B1 | * | 3/2001 | Ellingboe .............. 315/111.51 |

OTHER PUBLICATIONS

Cheung et al., "Method of Producing Silicon–on–Insulator Substrates", *University of Calif. Berkeley—Office of Technology Licensing/Invention and Technology Disclosure*, pp. 1–4, Jun. 17, 1994.

Hu et al., *Proposal to: The Air Force Office of Scientific Research*, Jun. 6, 1993–Jun. 5, 1996, Joint Services Electronics Program, Bolling Air Force Base, Washington, D.C., Proposal No. UCB/ERL–93/19, "Renewal of the Joint Services Electronics Program's Support of the Basic Research Program of the Electronics Research Laboratory," Submitted by: The Regents of the Univ. of Calif./Electronics Research Laboratory/College of Engineering, pp. 1–7.

Zhang et al., "Low–Energy Separation By Implantation of Oxygen Structures Via Plasma Source Ion Implantation," *Appl. Phys. Lett.*, 65(8):962–964 (1994).

* cited by examiner

SYSTEM FOR THE PLASMA TREATMENT OF LARGE AREA SUBSTRATES

CROSS REFERENCE TO RELATED APPLICATIONS

This application is a continuation application of U.S. Pat. No. 08/878,005, filed on Jun. 18, 1997, which is a continuation-in-part of U.S. application No. 08/503,973, filed on Jul. 19, 1995, now U.S. Pat. No. 5,653,811.

STATEMENT REGARDING FEDERALLY SPONSORED RESEARCH OR DEVELOPMENT

Not Applicable

BACKGROUND OF THE INVENTION

Plasma treatment of large area substrates such as glass or semiconductor substrates used in the fabrication of flat panel displays or 300 mm silicon wafers respectively pose a series of problems that do not occur in the processing of small area substrates. One problem is simply the generation of plasmas of sufficient area to treat the large area substrate. A second problem is the maintenance of the uniformity of the plasma density and chemistry over such a large area.

The use of inductively or transformer coupled plasma sources (ICP and TCP, respectively) are affected both by the difficulty of maintaining plasma uniformity using inductive coil antenna designs and the cost of fabricating and maintaining such systems which require large and thick quartz windows for coupling the antenna radiation into the processing chamber. The use of such thick quartz windows results in an increase in rf power (and reduction in efficiency) due to heat dissipation within the window.

The use of Electron Cyclotron Resonance (ECR) and Helicon type sources are limited by the difficulty in scaling the resonant magnetic field to large areas when a single antenna or waveguide is used. Furthermore, most ECR sources utilize microwave power which is more expensive and difficult to tune electrically. The use of hot cathode plasma sources results in the contamination of the plasma environment due to the evaporation of cathode material, while cold cathode sources result in contamination due to exposure of the cold cathode to the plasma generated.

The present invention avoids these problems encountered by previous large area plasma processing systems.

BRIEF SUMMARY OF THE INVENTION

The present invention relates to an easily scalable and maintainable system for producing a uniform plasma of any size. In one embodiment a plurality of rf plasma sources are removably attached to the dielectric windows such as glass or quartz of a vacuum processing chamber, while in another embodiment each of the plurality of sources includes its own window and is attached to the chamber. Plasma measuring probes within the chamber provide information on the plasma uniformity and this information is used to control the rf energy applied to each of the rf plasma sources so as to maintain the desired uniformity. In one embodiment, the plasma measuring probes are Langmuir probes. In another embodiment, the probes are Faraday cups. In yet another embodiment, the probes are optical probes.

In another embodiment, a plasma source includes a quartz window with an integral tube for gas introduction. Several of such plasma sources using different gases may be combined in a linear array for the sequential treatment of substrates in an inline processing system.

In a further embodiment multiple antennae rf sources are used to provide a uniform plasma during the pulsing phase and steady state in order to provide a uniform ion implantation dose to a large area substrate. The plasma source is stationary and the wafers are transported through the plasma or the wafers are stationary and the plasma is transported past the wafers.

BRIEF DESCRIPTION OF THE SEVERAL VIEWS OF THE DRAWING

This invention is pointed out with particularity in the appended claims. The above and further advantages of this invention may be better understood by referring to the following description taken in conjunction with the accompanying drawing, in which:

DETAILED DESCRIPTION OF THE INVENTION

Figure 1:
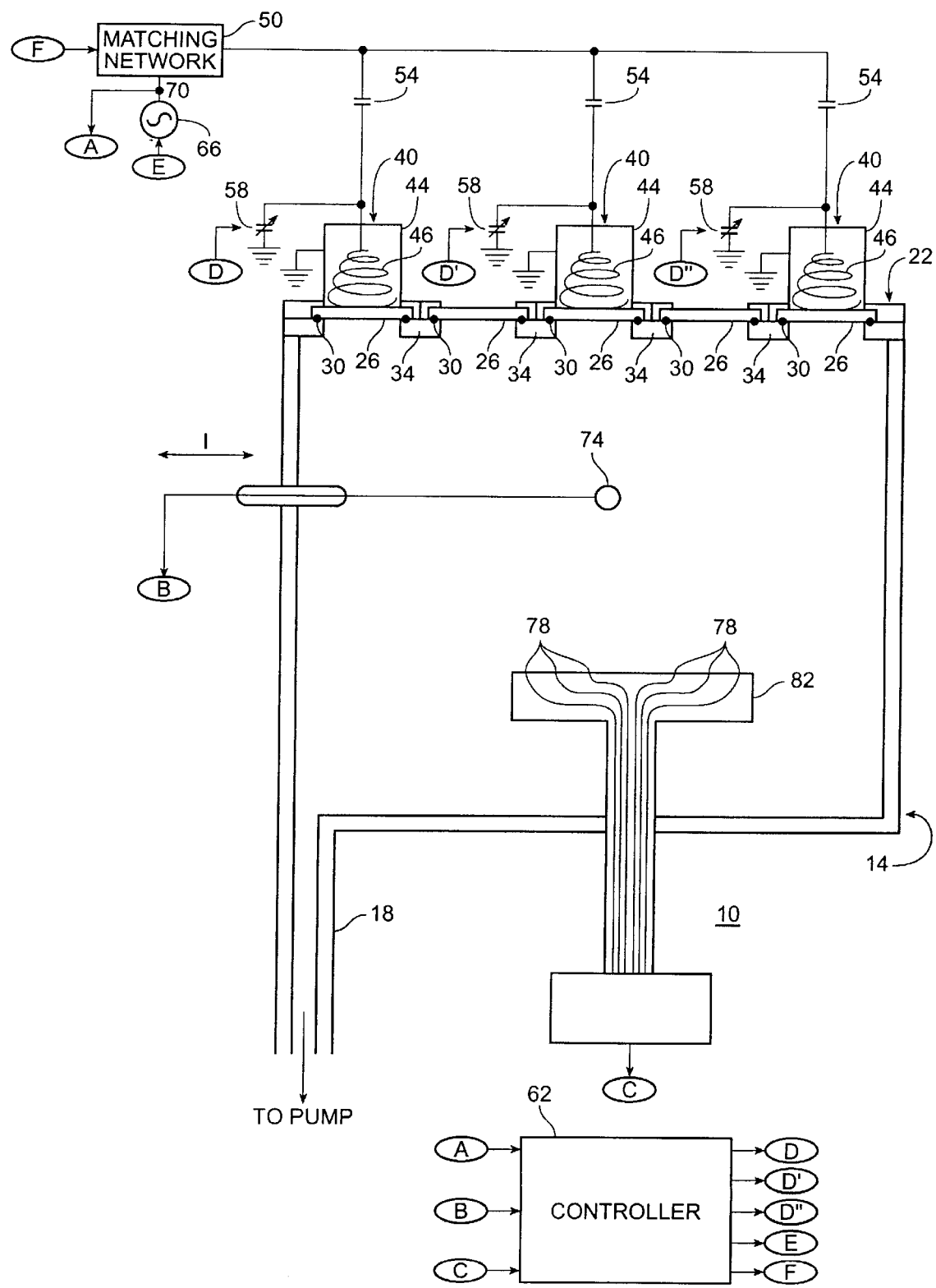
FIG. 1 is a block diagram of an embodiment of the plasma treating system of the invention.

In brief overview and referring to FIG. 1, an embodiment of the system of the invention 10 includes a vacuum chamber 14 having a vacuum port 18 connected to a vacuum pump (not shown). In the embodiment shown, the system 10 includes a series of dielectric windows 26 vacuum sealed by o-rings 30 and attached by removable clamps 34 to the upper surface 22 of the vacuum chamber 14. Removably attached to some of these dielectric windows 26 are rf plasma sources 40, in one embodiment having a helical or pancake antennae 46 located within an outer shield/ground 44. Other embodiments of the antennae using capacitive or inductive coupling may be used. Cooling of each antenna is accomplished by passing a cooling fluid through the antenna. Cooling is typically required only at higher power. The windows 26 without attached rf plasma sources 40 are usable as viewing ports into the chamber 14. The removability of each plasma source 40 permits the associated dielectric window 26 to be cleaned or the plasma source 40 replaced without the vacuum within the system 10 being removed. Although glass windows are used in this embodiment, other dielectric material such as quartz or polyethylene may be used for the window material.

Each antenna 46 is connected to a rf generator 66 through a matching network 50, through a coupling capacitor 54. Each antenna 46 also includes a tuning capacitor 58 connected in parallel with its respective antenna 46. Each of the tuning capacitors 58 is controlled by a signal D, D', D" from a controller 62. By individually adjusting the tuning capacitors 58, the output power from each rf antenna 46 can be adjusted to maintain the uniformity of the plasma generated. Other tuning means such as zero reflective power tuning may also be used to adjust the power to the antennae. In one embodiment, the rf generator 66 is controlled by a signal E from the controller 62. In one embodiment, the controller 62 controls the power to the antennae 46 by a signal F to the matching network 50.

The controller 62 adjusts the tuning capacitors 58 and the rf generator 66 in response to a signal A from a sensor 70 (such as a Real Power Monitor by Comdel, Inc., Beverly, Mass.) monitoring the power delivered to the antennae 46, a signal B from a fast scanning Langmuir probe 74 directly measuring the plasma density and a signal C from a plurality of Faraday cups 78 attached to a substrate wafer holder 82. The Langmuir probe 74 is scanned by moving the probe (double arrow I) into and out of the plasma. With these sensors, the settings for the rf generator 66 and the tuning capacitors 58 may be determined by the controller prior to the actual use of the system 10 to plasma treat a substrate. Once the settings are determined, the probes are removed and the wafer to be treated is introduced. In another embodiment of the system, the probes are left in place during processing to permit real time control of the system. In such an embodiment using a Langmuir probe, care must be taken to not contaminate the plasma with particles evaporating from the probe and to not shadow the substrate being processed. In yet another embodiment of the system, the characteristics of the system are determined at manufacture and the system does not include plasma probes.

Figure 2:
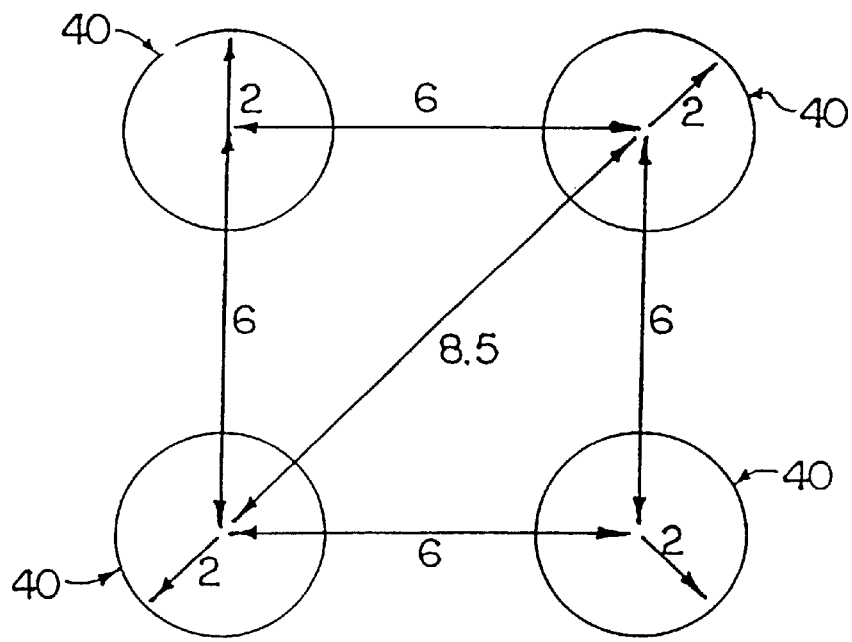
FIG. 2 is a top view of a configuration of sources to provide a large area plasma coverage using small area plasma sources.

Referring to FIG. 2, the configuration of plasma sources 40 may be such that a plurality of physically smaller plasma sources 40 produce a uniform plasma over an area greater than that of sum of the areas of the individual sources. In the embodiment of the configuration shown, four four-inch diameter plasma sources 40 spaced at the corners of a square at six inch centers produce a plasma substantially equivalent to that generated by a single twelve inch diameter source. Therefore, by providing a vacuum chamber 14 with a plurality of windows 26, the various configurations of plasma sources 40 may be formed to produce a uniform plasma of the shape and uniformity desired. Antennae such as those depicted do not result in rf interference between sources when properly shielded as shown.

Multiple rf plasma sources can excite electron cyclotron resonance in the presence of a multi-dipole surface magnetic field. Such a surface magnetic field would, for example, be approximately 1 KG at the pole face and would drop to a few Gauss at about 10 cm. from the pole face. In such a system, electron cyclotron resonance may be established, with the electron cyclotron resonance frequency (in Hz) being given by the expression $v=2.8\times10^6$ (B) where B is the magnetic field strength in Gauss. Thus, if the fundamental electron cyclotron resonance frequency is 13.56 MHz (that is, the frequency supplied by the rf generator) the magnetic field required (as applied by the magnets) is 4.8 G, for resonance coupling to take place. Higher harmonics of the fundamental resonance frequency may be achieved by increasing the magnetic field proportionately. Thus for a second harmonic to be coupled, the magnetic field would have to be increased to 9.6 G. Such ECR coupling is most effective at lower pressures (P<1 mTorr) . The use of the small rf plasma sources permit such magnets to be positioned so as to make electron cyclotron resonance possible.

Figure 3:
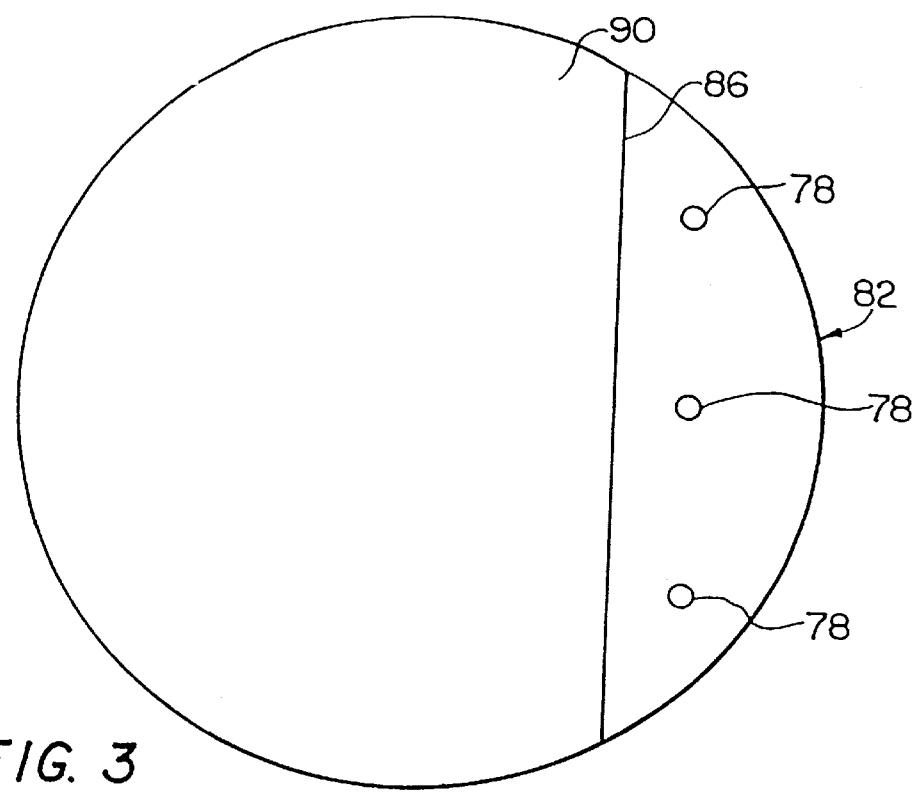
FIG. 3 is a plan view of an embodiment of a wafer holder with built-in faraday cups.
Figure 3A:
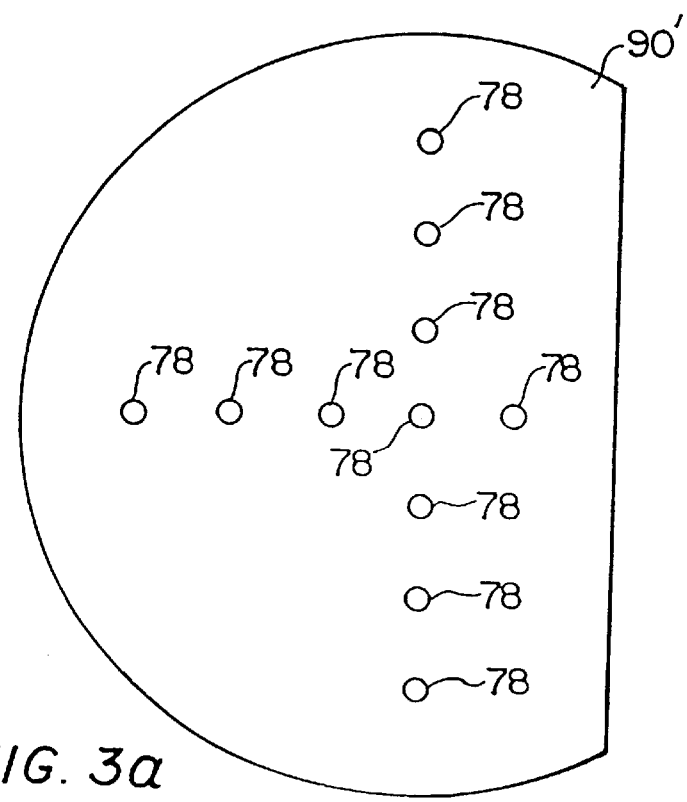
FIG. 3a is a plan view of an embodiment of a Si test wafer with imbedded faraday cups.

The faraday cups 78 used to measure the uniformity of the field and the plasma dose, in one embodiment, are positioned near one edge in the surface of the wafer holder 82 (FIG. 3). The flat edge 86 of wafer 90 is positioned on the wafer holder 82 such that faraday cups 78 of the wafer holder 82 are exposed to the plasma. In this way the plasma dose experienced by the wafer 90 can be directly measured. Alternatively, a special wafer 90', as shown in FIG. 3a, is fabricated with a plurality of faraday cups 78 embedded in the wafer 9'. This special wafer 90' is used to set the rf generator 66 and the tuning capacitors 58 to achieve the desired plasma density and uniformity. Once the operating parameters have been determined, the special wafer 90' is removed and the wafers 90 to be processed placed on the wafer holder 82.

Figure 4:
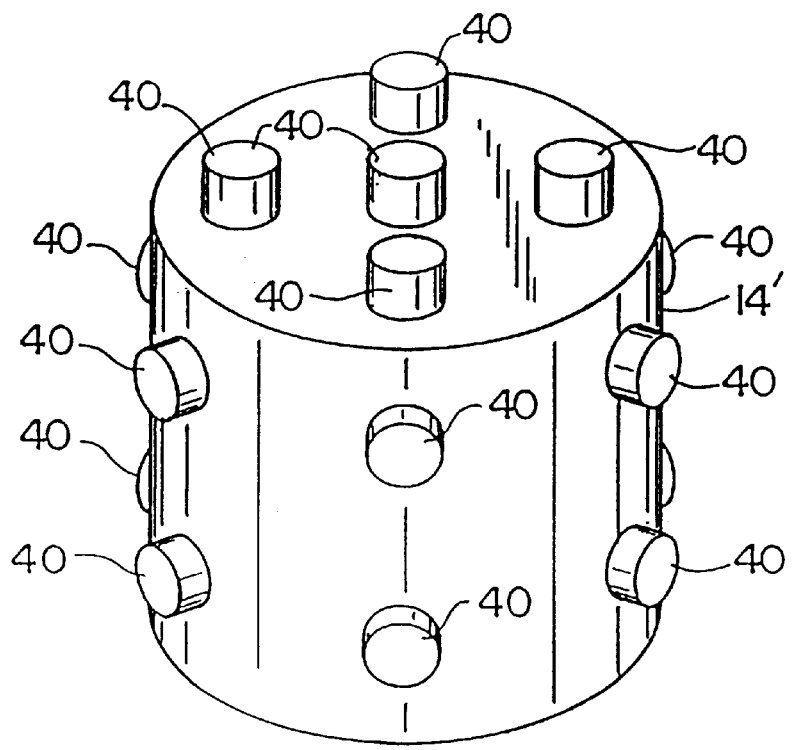
FIG. 4 is a perspective view of an embodiment of the invention configured as a volume source.

Referring to FIG. 4, although the system 10 has been described in terms of a planar array of plasma sources 40 located on the upper surface of the vacuum chamber 14, the plasma sources 40 may be distributed over other surfaces of the vacuum chamber 14' to generate a uniform volume of plasma. Such a system is particularly effective in batch processing.

Figure 5:
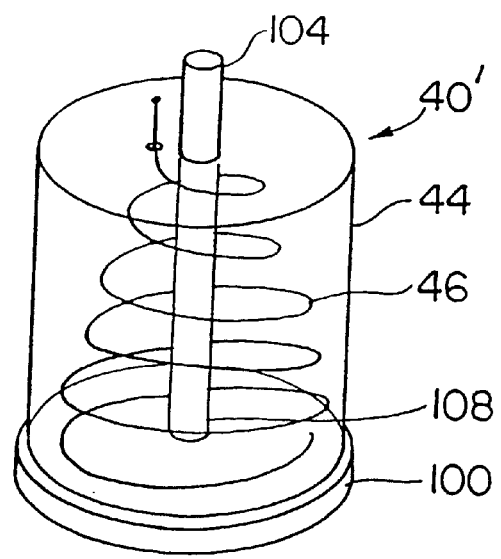
FIG. 5 is a perspective view of an embodiment of plasma source of the invention with integral gas feed.
Figure 6:
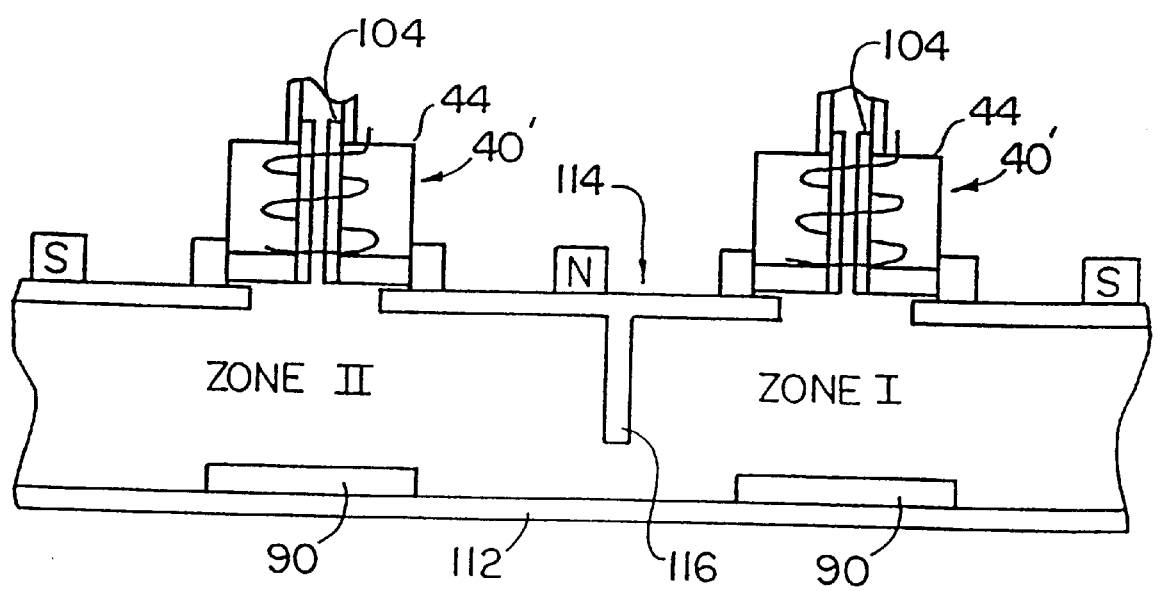
FIG. 6 is a cross-sectional view of an embodiment of a continuous plasma treatment device using a plurality of plasma sources shown in FIG. 5.

Referring to FIG. 5, in another embodiment, a quartz window 100 is not attached to the vacuum chamber 14, but instead encloses one end of the shield 44 of the plasma source 40'. In this embodiment, a tube 104 attached to an opening 108 in the quartz window 100 provides a gas feed to form a plasma of a specific gas. In this case, the plasma source 40' is not attached to a window 26 in the wall of the vacuum chamber 14, but is instead attached to the vacuum chamber 14 itself. Such plasma sources 40' can produce plasmas from specific gasses as are required by many processes. Several such plasma sources 40' can be aligned to sequentially treat a wafer 90 with different plasmas as in the embodiment of the inline system shown in FIG. 6. In this embodiment, wafers 90 are moved by a conveyor 112 through sequential zones, in this embodiment zones I and II, of a continuous processing line 114. Each zone is separated from the adjacent zones by a baffle 116. In one embodiment, the gas in zone I is $SiH_4$ used in Si-CVD processing, while the gas in zone II is $PH_3$ used in doping. In another embodiment, a cluster tool having load-locks to isolate each processing chamber from the other chambers, and equipped with a robot includes the rf plasma sources 40 of the invention for plasma CVD and plasma etching.

Figure 7:
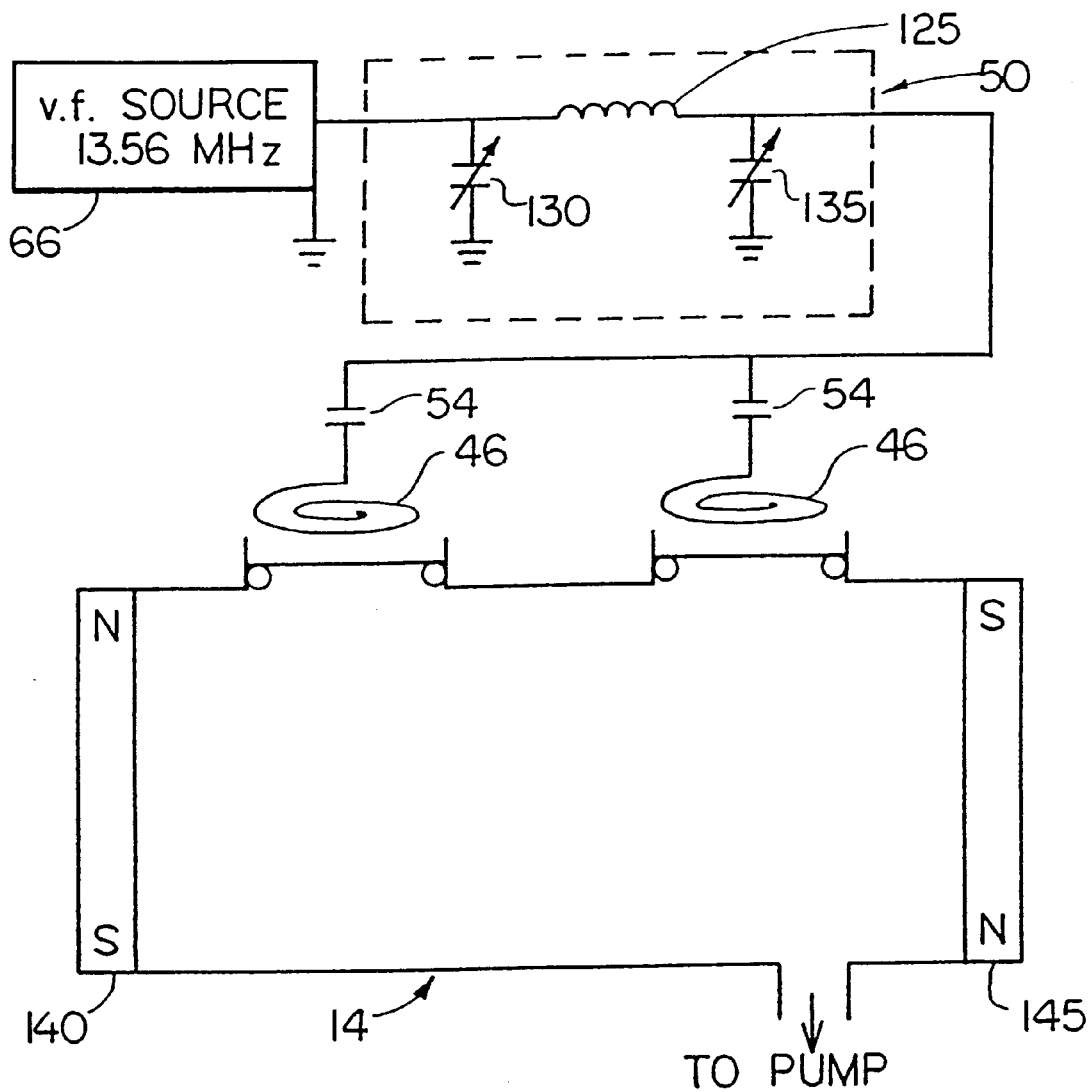
FIG. 7 is a schematic diagram of a system utilizing two plasma sources.

FIG. 7 depicts an embodiment of the system of the invention using two plasma sources. In this embodiment each source is an inductive pancake antenna 3–4 inches in diameter. Each antenna 46 is constructed of a ¼ inch copper tube and contains 5–6 turns. Each antenna 46 is connected to a matching network 50 through a respective 160 pf capacitor. The matching network 50 includes a 0.03 µH inductor 125 and two variable capacitors 130, 135. One variable capacitor 130 is adjustable over the range of 10–250 pf and the second capacitor 135 is adjustable over the range of 5–120 pf. The matching network 50 is tuned by adjusting the variable capacitor 130, 135. The matching network 50 is in turn connected to an rf source 66 operating at 13.56 mHz. A series of magnets 140, 145 are positioned around the circumference of the chamber in alternating polarity every 7 cm to form a magnetic bucket.

With the chamber operating at 1 m Torr pressure, the power to the antenna 46 is 25 W per antenna or about 50 W total. With the pressure in the chamber reduced to 0.1 m Torr, the power is increased to 200 W per antenna or 400 W total. The resulting plasma at 50 W total power has a substantially uniform density of $10^{11}/cm^3$. The uniformity and the density may be further improved using four of such sources.

Figure 8:
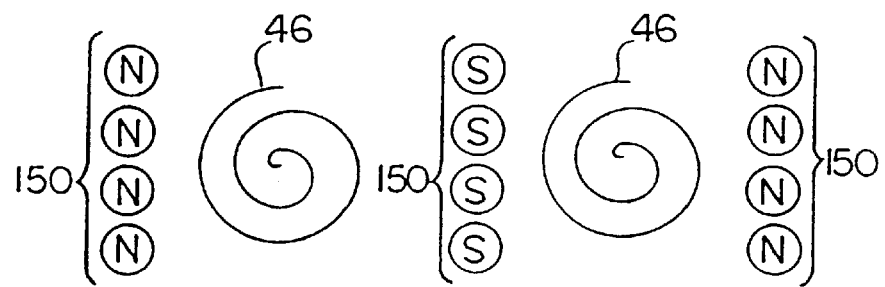
FIG. 8 depicts an embodiment of an arrangement of surface magnets for ECR plasma generation in a two source system.
Figure 8A:
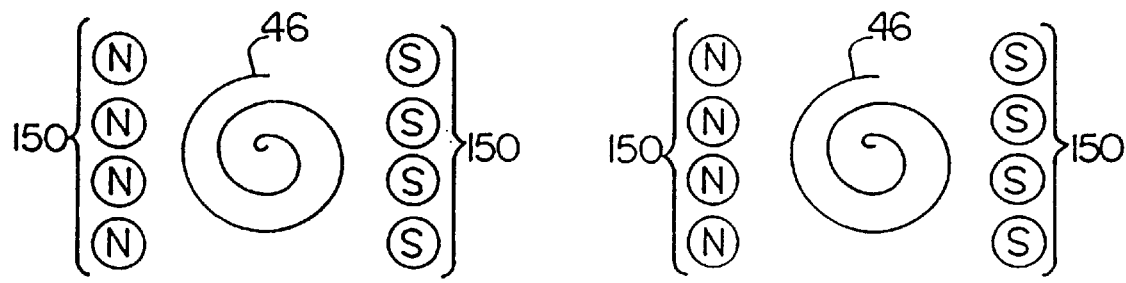
FIG. 8a depicts another embodiment of an arrangement of surface magnets for ECR plasma generation.

Referring to FIG. 8, one embodiment of the arrangement of magnets for ECR generation utilizes a plurality of magnets 150 adjacent the antenna 46. In this embodiment, the plurality of the magnets 150 is reversed between the antennae. FIG. 8a depicts another embodiment in which each source has its own set of magnets. Other magnet configurations are possible.

Figure 9:
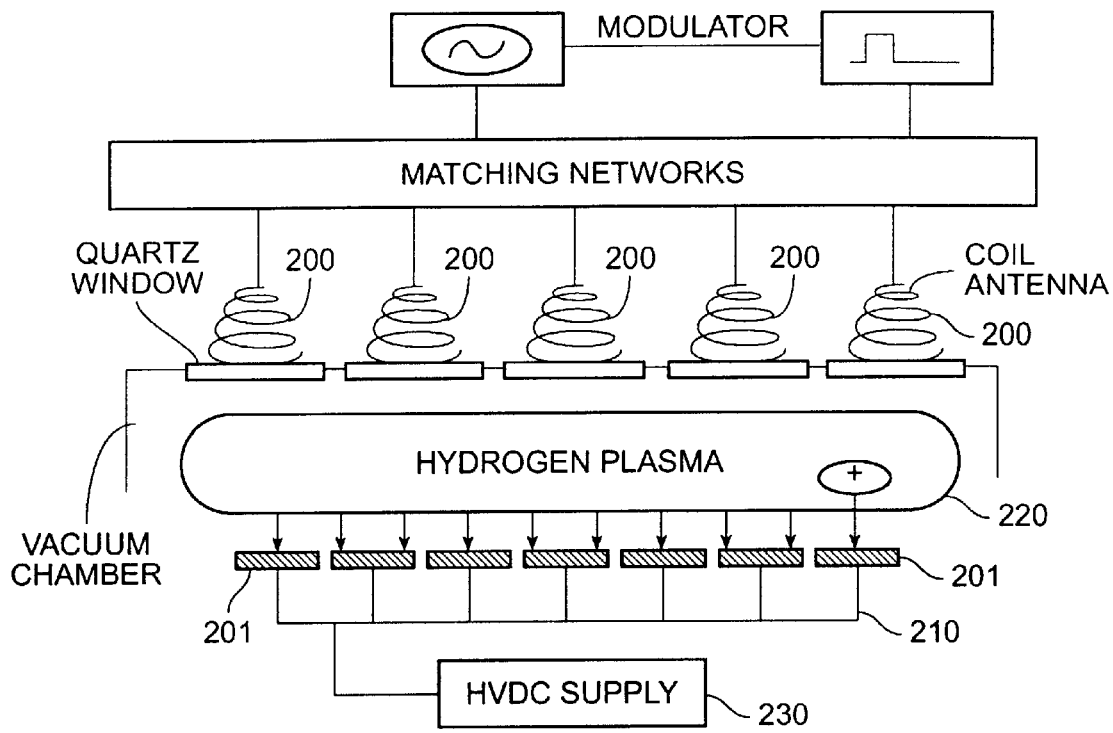
FIG. 9 is a diagram of a Separation by Plasma Ion Implantation Technology (SPIT) treatment device.

Referring to FIG. 9, an embodiment of a large area substrate consists of a high voltage wafer holder 210 on which many wafers 201 can be placed. If the holder 210 is biased at a large negative voltage (DC) and transported along the linear length of the plasma source 220, a desired ion implantation dose will be reached. This is a simple way to achieve the separation of thin-film silicon layer by ion implantation as used in the Silicon-On-Insulator (SOI) technology. Alternatively, the plasma source 200 could be pulsed and the wafer holder 210 remains stationary to achieve the same effects.

The multiple antennae plasma source 200 is especially useful for processing of silicon wafers 201 when large ion implantation dosages are desired. The throughput of such a system is extremely large in comparison with any other system including conventional high current beam-line implantation. For example, a particular thin-film transfer technique using hydrogen ion implantation into Si-wafer to separate the top silicon layer with the bulk wafer via hydrogen ion embitterment. The dosage required is $10^{16}$ to $10^{17}$ ions-cm$^{-2}$. Another technique is the Separation by Ion IMplantation of Oxygen (SIMOX) having oxygen implantation dosages of $10^{18}$ ions-cm$^{-2}$. Being the best conventional high current ion implantation available in the market will require long implantation time, up to several hours. Using the large area plasma source 200 and the described process and apparatus allows the implantation time to approach seconds for batch processing of a large number of wafers 201.

Two methods can be used for the batch processing of wafers. The first method includes pulsing the large area plasma source 200 with a negative high voltage dc bias from the HVDC supply 230, which is connected to the wafers 201. When a plasma 220 forms and expands to the wafers 201, all of the ions are accelerated to the wafer by the electric field at the wafer surface. As a result, all of the accelerated ions have the same energy because of the large dc electric field at the wafer surface in comparison to either the plasma potential or the kinetic energy of the ions as the plasma expands. As the implant dose will be controlled by the exposure time of the wafer to the plasma, the plasma is turned off when the desired dosage is reached. The large plasma source allows essentially infinite number of wafer exposure (implantation) at a short time, limited by the available high voltage power rating of the wafer bias. The throughput of such a system is potentially 100 to 1,000 times that of conventional technology.

Figure 10:
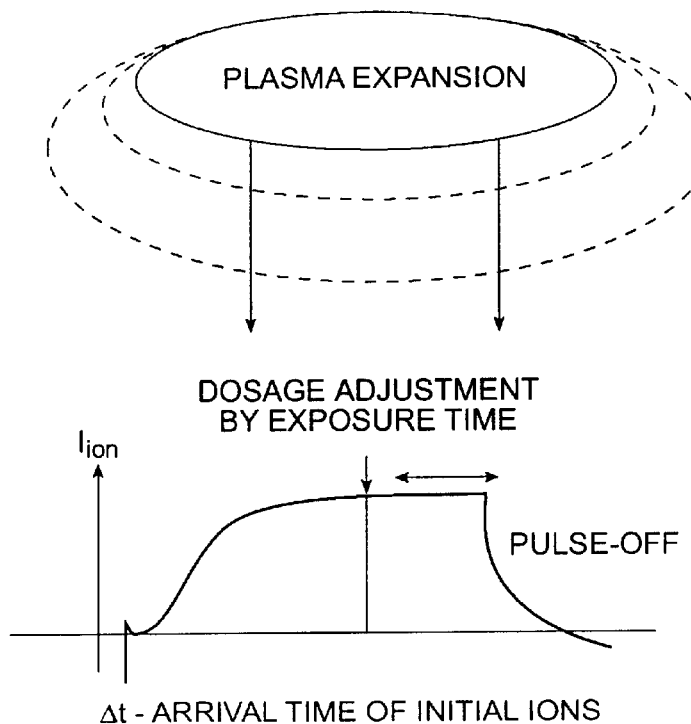
FIG. 10 is a graph of the ion current (implantation dose) provided by the device of FIG. 9.

The uniformity of the implant can be controlled precisely as the individual rf coils can be tuned separately for the optimum plasma uniformity. FIG. 10 shows the dosage relation to the exposure time.

Figure 11:
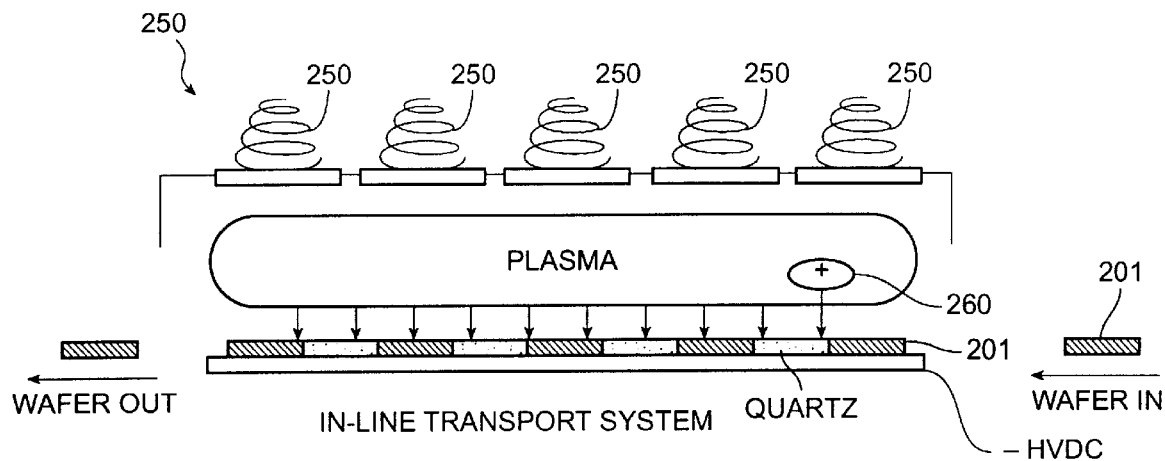
FIG. 11 is a diagram of an In-line a plasma processing system.
Figure 12:
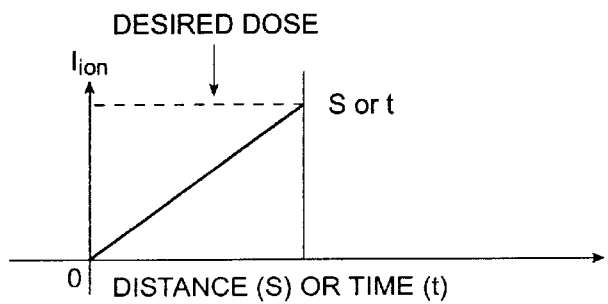
FIG. 12 is a graph of the ion current (implantation dose) provided by the system of FIG. 11.

The second method and apparatus is known as In-line processing, shown in FIG. 11. The large area plasma source 250 is operated steady-state and the wafers 201 are moving from one end to the other end as the exposure time t=S/V where S is the length of a plasma 260 (linear length of the plasma source) and V is the speed of the wafer transport. FIG. 12 shows the ion dose relation with the distance or time relationship for this embodiment. Again, the uniformity can be adjusted by controlling the tuning and power level of each rf coil. The throughput of such a system is also extremely high.

Figure 14:
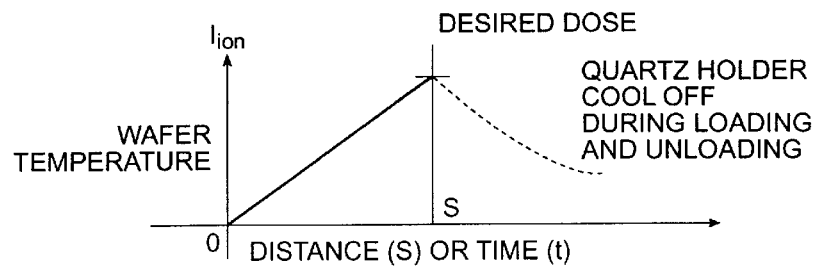
FIG. 14 is a graph of the ion current (implantation dose) provided by the device of FIG. 13.
Figure 15:
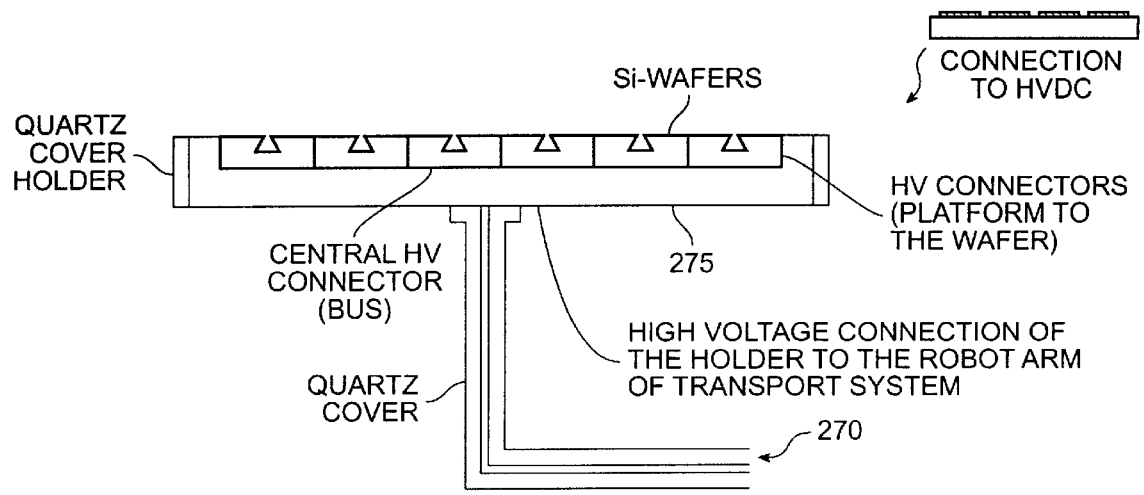
FIG. 15 is a diagram of the high voltage connections to the wafer and robot arm of the device of FIG. 11.
Figure 16:
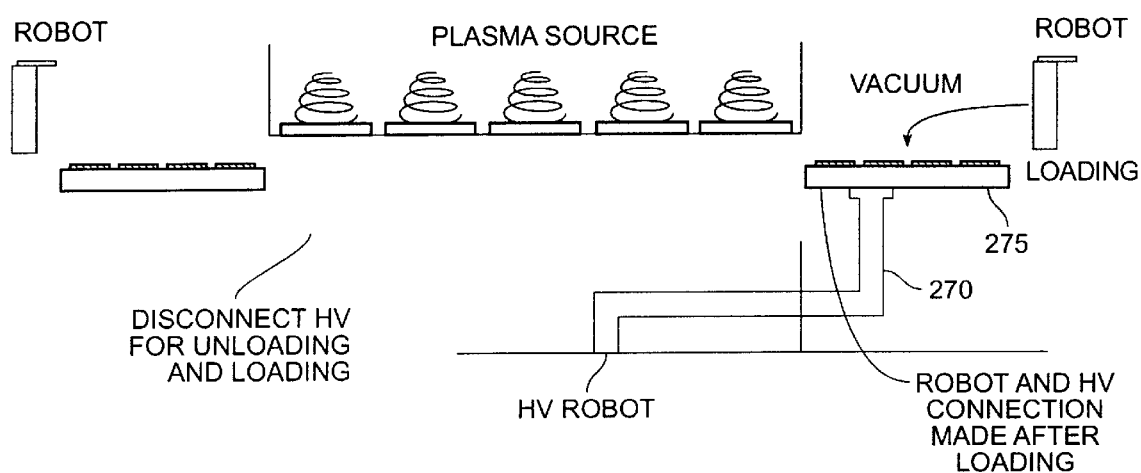
FIG. 16 is a diagram of the high voltage connections to the wafer and robot arm of the device of FIG. 13.

In such a system, with the adjusting of the plasma density and the ion dosage per sec (dose rate), it's possible to control the wafer temperature precisely (with and without external wafer cooling means). A simplified version of the in-line system, shown in FIG. 13, can also be used which results in simple equipment design and which will not need wafer cooling for most SPIT applications. FIG. 14 depicts the ion dose and temperature profile of an individual wafer. In such a system, the large area plasma source allows a simple connection procedure of the negative high-voltage bias to the wafer and the wafer transport robot system as shown in FIGS. 15 and 16.

Figure 13:
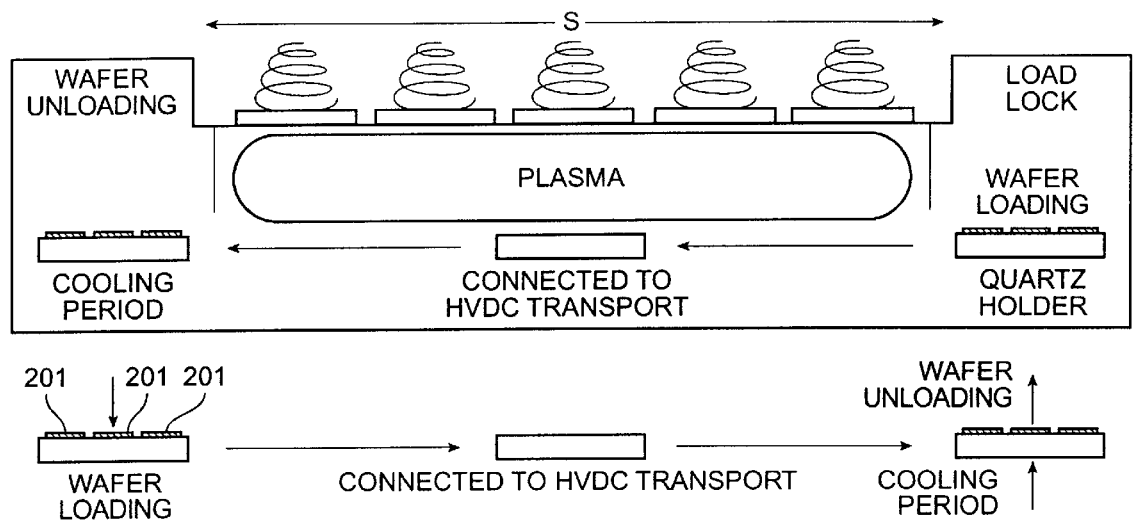
FIG. 13 is a diagram of another embodiment of a plasma treatment device.

After the wafers are loaded in the loading port (FIG. 13), the robot transport system with high voltage connection 270 will connect to the wafer holder 275 moving through the plasma for the desired exposure as shown in FIG. 13 and repeat the procedure and send the wafer back for a second batch of exposure.

Multiple antennae rf sources are used to provide a uniform plasma during the pulsing phase and the steady state as to give uniform ion implantation dose to a large area substrate which is biased at a negative voltage. When the plasma is pulsed on, other types of excitation depend on the particular ionization mechanism (i.e. in the case of electron cyclotron resonant ECR source, a resonance ionization process), the location of plasma initiation is often localized. As such, the uniformity of such sources during the turn-on phase is poor. It is also takes a long time for such plasma sources to reach steady-state with the desired uniformity (preferably less than 5%) for normal plasma processes. The multiple antennae source has multiple ionization locations and are individually tuned by the electronic and tuning circuits. As such, a uniform plasma is provided from the pulsing phase all the way to steady state by control of the individual antenna. This is done precisely with the feedback scheme disclosed in co-pending U.S. patent application Ser. No 08/503,973, the disclosure of which is incorporated herein by reference.

Having shown the preferred embodiment, those skilled in the art will realize many variations are possible which will still be within the scope and spirit of the claimed invention. Therefore, it is the intention to limit the invention only as indicated by the scope of the claims.

I claim:

1. A cluster tool for providing plasma treatment to a substrate, comprising:
   a plurality of chambers, wherein at least one of said chambers performs ion implantation to said substrate;
   a dielectric window provided on a surface of said at least one chamber which performs ion implantation to said substrate, said dielectric window having a first side and second side, said first side of dielectric window facing the outside of said at least one chamber and said second side of dielectric window facing the inside of said at least one chamber;
   a plasma source provided external to said at least one chamber which performs ion implantation to said substrate, said plasma source facing said first side of said dielectric window and being at a distance proximate enough to provide a plasma within said at least one chamber, said plasma source including:
      an antenna facing said first side of said dielectric window, said antenna being coupled to an rf power source to generate said plasma within said at least one chamber, and
      a shield having an opening that faces said first side of said dielectric window, said shield cooperating with said first side of said dielectric window to enclose said antenna; and
   a transporter for inserting said substrate into at least one of said plurality of chambers to expose said substrate to said plasma therein and then removing said substrate therefrom.

2. The cluster tool of claim 1 wherein said transport element includes a robotic arm.

3. The cluster tool of claim 1 further comprising a bias power which is electrically coupled to said transporter to provide a bias voltage to said substrate while said substrate is being exposed to said plasma.

4. The cluster tool of claim 1 wherein said plasma source is a pulsed plasma source.

5. The cluster tool of claim 1 wherein said plasma source is a steady-state plasma source.

6. The cluster tool of claim 1 wherein one or more of said plurality of chambers includes a plurality of dielectric windows.

7. The cluster tool of claim 6 wherein a plurality of plasma sources are provided facing said plurality of dielectric windows.

8. The cluster tool of claim 7 wherein said each of said plurality of plasma sources is separately coupled to a corresponding rf generator.

9. The cluster tool of claim 8 wherein each of said plurality of plasma sources is configured, so that each plasma source may be tuned in order to provide a plasma of the shape and uniformity desired for a particular process.

10. The cluster tool of claim 1 wherein said plasma source comprises an antennae.

11. The cluster tool of claim 1 wherein said antennae is helical.

12. The cluster tool of claim 1 wherein said dielectric windows are constructed of quartz.

13. The cluster tool of claim 1 wherein said dielectric windows are constructed of glass.

14. The cluster tool of claim 1 wherein said dielectric window is used as a viewing port into said chamber.

15. The cluster tool of claim 1 wherein said plasma source located external to said chamber allows said plasma source to be replaced without disturbing the vacuum within said chamber.

16. A cluster tool for performing plasma treatment on a substrate, comprising:
   a loading area;
   a holder wherein a substrate is loaded onto said holder in said loading area;
   a plurality of chambers, wherein at least one of said chambers performs ion implantation to said substrate;
   a dielectric window provided on a surface of said at least one chamber which performs ion implantation to said substrate;
   a plasma source provided external to said at least one chamber which performs ion implantation to said substrate, said plasma source being at a distance proximate enough to provide a plasma within said at least one chamber, said plasma source including:
      an antenna facing said dielectric window, said antenna being coupled to an rf power source to generate said plasma within said at least one chamber, and
      a shield having an opening that faces said dielectric window, said shield cooperating with said dielectric window to enclose said antenna; and
   a load lock configured to isolate the environment within one or more of said plurality of chambers, so that said substrate can be treated with a plasma; and a transport device for moving said holder and said substrate from said loading area into and out of said chamber.

17. The cluster tool of claim 16 wherein said transport device comprises a robotic arm.

18. The cluster tool of claim 16 wherein said transport device is coupled to a power supply to bias said substrate.

19. The cluster tool of claim 16 wherein said holder comprises quartz.

20. A cluster tool for performing plasma treatment on a substrate, comprising:
   a plurality of chambers, wherein at least one of said chambers performs ion implantation to said substrate;
   a dielectric window provided on a surface of said at least one chamber which performs ion implantation to said substrate, said dielectric window having an aperture therethrough to define an input port to said at least one chamber;
   a plasma source provided external source being at a distance proximate enough to provide a plasma within said at least one chamber, wherein said plasma source includes:
      a shield having an opening at a first end and an aperture at a second end, wherein said opening faces said dielectric window, and
      an rf antenna enclosed within said shield and said dielectric window to provide said plasma within said at least one chamber; and
   a transport device for inserting said substrate into at least one of said plurality of chambers to expose said substrate to said plasma therein and then removing said substrate therefrom.

21. The cluster tool of claim 20, further comprising:
   a tube extending through said shield from said aperture to said opening and coupled to said input port to provide a process gas into said at least one chamber.

* * * * *